United States Patent [19]
Asai et al.

[11] Patent Number: 5,796,206
[45] Date of Patent: Aug. 18, 1998

[54] CONTROLLER AND CONTROLLING METHOD FOR PIEZOELECTRIC ACTUATOR

[75] Inventors: Mitsuru Asai, Aichi-ken; Nobuo Kamiya, Nisshin; Tomoji Ishikawa, Okazaki; Chihiro Nishikawa, Toyota, all of Japan

[73] Assignees: Kabushiki Kaisha Toyota Chuo Kenkyusho, Aichi-ken; Toyota Jidosha Kabushiki Kaisha, Toyota, both of Japan

[21] Appl. No.: 725,679

[22] Filed: Oct. 2, 1996

[30] Foreign Application Priority Data

Oct. 5, 1995 [JP] Japan ................. 7-258636

[51] Int. Cl.$^6$ ........................................... H01L 41/08
[52] U.S. Cl. ........................ 310/317; 310/330; 310/315
[58] Field of Search ............................. 310/315, 317, 310/330–332

[56] References Cited

U.S. PATENT DOCUMENTS

| | | | |
|---|---|---|---|
| 3,573,781 | 4/1971 | Shoh | 310/317 X |
| 3,921,015 | 11/1975 | Obeda et al. | 310/317 |
| 4,106,065 | 8/1978 | Ravizza | 310/330 X |
| 4,608,506 | 8/1986 | Tanuma | 310/315 |
| 4,625,137 | 11/1986 | Tomono | 310/317 |
| 4,851,871 | 7/1989 | Ooe et al. | 310/317 X |
| 5,384,507 | 1/1995 | Takada et al. | 310/317 |
| 5,387,834 | 2/1995 | Suzuki | 310/317 |
| 5,466,985 | 11/1995 | Suzuki | 310/317 X |

FOREIGN PATENT DOCUMENTS

| | | |
|---|---|---|
| 0 147 112 | 7/1985 | European Pat. Off. . |
| 61-289682 | 12/1986 | Japan . |
| 62-57265 | 3/1987 | Japan . |
| 1-226187 | 9/1989 | Japan . |
| 2-201977 | 8/1990 | Japan . |

OTHER PUBLICATIONS

Patent Abstracts of Japan, vol. 014, No. 489, (E–0994), Oct. 24, 1990. JP 2 201977, Aug. 10, 1990.

*Primary Examiner*—Mark O. Budd
*Attorney, Agent, or Firm*—Oblon, Spivak, McClelland, Maier & Neustadt, P.C.

[57] ABSTRACT

A method for controlling a piezoelectric actuator includes: a safety range setting process in which a safety range $V_{range1}$ or $V_{range2}$ of an applied voltage is set so that an area of 180° domain rotation is within one third or less of an area of full 180° domain rotation $S_1$ or $S_2$ in a positive or negative region of the applied voltage; and a driving process in which the voltage is applied to the piezoelectric actuator with a limitation of the safety range $V_{range1}$ or $V_{range2}$. A controller which drives a piezoelectric actuator according to the controlling method is also provided. A temperature compensation is applied if necessary. The 180° domain rotation is limited by the lower or upper limit of the safety range, so that local concentration of inner stress is suppressed and the actuator is driven at its maximum ability without cracks or splits.

8 Claims, 7 Drawing Sheets

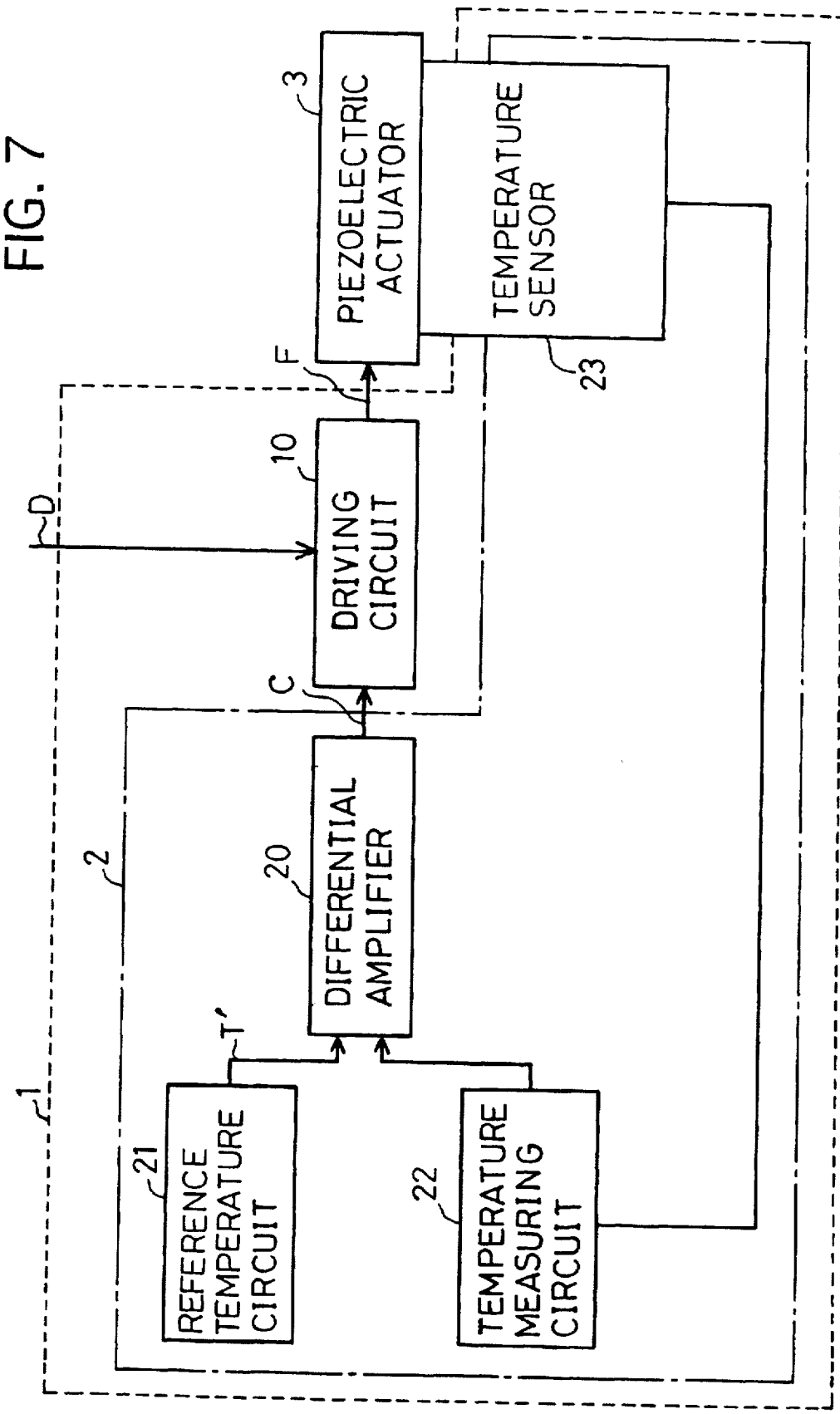

CONTROLLER AND CONTROLLING METHOD FOR PIEZOELECTRIC ACTUATOR

BACKGROUND OF THE INVENTION

1. Field of the Invention

The present invention relates to a controller for a piezoelectric actuator and a method for controlling a piezoelectric actuator. The invention belongs to an engineering field of controlling piezoelectric actuators, where the piezoelectric actuators can be used in many kinds of precision machineries and the like.

2. Description of the Related Art

Japanese Unexamined Patent Publication (KOKAI) No. 2-201977, No. 62-57265, No. 61-289682, and No. 1-226187 have disclosed some methods to control a voltage to be applied to a piezoelectric actuator. The purpose of the methods is to increase deformation of a piezoelectric actuator, or to lower a voltage to be applied to a piezoelectric actuator, or to prevent depression of polarization in piezoelectric materials which form a piezoelectric actuator, or so on.

To increase deformation of a piezoelectric actuator, said KOKAI No.2-201977 and No.1-226187 disclose control methods in which the upper limit or the lower limit of applied voltage is set in the region of non-coercive electric field of a piezoelectric material, where the limit is on the opposite direction from the polarization of the piezoelectric material.

To prevent depression of polarization in piezoelectric materials, said KOKAI No.62-57265 discloses control methods in which the upper limit or the lower limit of applied voltage is set in the range which stands for 1/4 to 9/10 of a coercive electric field of a piezoelectric material, where the limit is on the opposite direction from the polarization of the piezoelectric material.

SUMMARY OF THE INVENTION

Every method of said KOKAI publications discloses limitation of at least one of the upper and lower limits of applied voltage. In any of said KOKAI publications, however, no consideration is made on preventing from break-out of splits or cracks in the piezoelectric material. Therefore, these technologies are not effective to prevent break-out of splits or cracks in the piezoelectric actuator.

According to the inventors' investigation, it is hard to prevent break-out of splits or cracks by the above technologies, which put limitation of applied voltage relative to the coercive electric field. That is to say, the above technologies are not able to put safety limitation in which splits or cracks would not break out and in which motion stroke of the piezoelectric actuator is long enough. That is because the limitation is set simply relative to the coercive electric field of the piezoelectric material.

Therefore, the purpose of the invention is to set safe limitation of applied voltage which is effective to operate a piezoelectric actuator, instead of the limitation set simply relative to the coercive electric field. That is to say, the invention is to provide a controller and a controlling method for a piezoelectric actuator, with which proper applied voltage limitation is set so that no cracks nor splits break out in the piezoelectric actuator even though the actuator is operated with strokes long enough just close to the designed stroke.

Thus, the inventors have made the following aspects of the invention to fulfill the purpose.

|Controller for piezoelectric Actuator|

(The First Aspect of The Invention)

The first aspect of the invention is a controller for a piezoelectric actuator which applies voltage to the actuator in a certain range to drive the actuator. The controller has applied voltage limiting means which set one of the upper applied voltage limitation and the lower, so that the area of 180° domain rotation of the piezoelectric material should be less than or equal to one third of an area of full 180° domain rotation of the material. The limitation stands for safety limit of applied voltage.

By the way, 90° domain rotation or 70.5° domain rotation could have been considered, but the current at such domain rotation is negligible, so that the inventors made consideration on the area of 180° domain rotation of the piezoelectric material.

Here, the area of full 180° domain rotation and the area of 180° domain rotation are defined as follows.

Sensing a small electric switching current flowing through a piezoelectric actuator when a voltage applied to the actuator is swept in the wide range in the positive region and in the negative, a hysteresis loop on the applied voltage vs. switching current plane is obtained as shown in FIG. 1. In a process in which the applied voltage reduces to zero, the hysteresis loop does not have a peak of the switching current. However, in another process in which the applied voltage increases, the hysteresis loop forms a peak of the switching current. That is to say, increasing the applied voltage in the positive region, the loop forms a peak of positive current i.e. $P_1$. On the other hand, increasing the absolute value of negative voltage, the loop forms another peak of negative current i.e. $P_2$. Each of the voltage levels $V_1$ and $V_2$ at the peaks $P_1$ and $P_2$ is called the coercive voltage. At a level of a coercive voltage, the yield field is applied to the piezoelectric material of the actuator.

As shown in FIG. 1, in a process sweeping the applied voltage from the positive region through the negative region, a certain level of the current at zero applied voltage forms an upper base line of the area $S_1$ with oblique lines. The area $S_1$ with lower current peak $P_1$ is defined as "the area of full 180° domain rotation". Now, an area from zero applied voltage to a certain applied voltage level is defined as "the area of 180° domain rotation". The area of 180° domain rotation with one third area of the area of full 180° domain rotation is defined as "the area of one third 180° domain rotation" which is shown as an delta area surrounded in thick line frame in FIG. 1. And a certain level of applied voltage which forms a vertical side of the delta area is defined as a lower limit $V_{lim1}$ of a safety range of the applied voltage.

Thus, a safety range of the applied voltage given by the invention is that the lower limit of a negative applied voltage should be set to be more positive than or equal to the lower limit $V_{lim1}$. On the other hand, an upper limit of applied voltage is not always necessary as far as no trouble such as dielectric breakdown occurs.

Similarly, a safety limit (the upper limit $V_{lim2}$) of the applied voltage can be set only in the positive voltage region. As shown in FIG. 2, in a process sweeping the applied voltage from the negative region through the positive region, a certain level of the switching current at zero applied voltage forms a base line of the area $S_2$ with oblique lines. The area $S_2$ with upper current peak $P_2$ is also defined as "the area of full 180° domain rotation". Now, an area from zero applied voltage to a certain applied voltage level is also defined as "the area of 180° domain rotation". The area of 180° domain rotation with one third of the area of full 180° domain rotation is also defined as "the area of one third 180° domain rotation" which is shown as an delta area surrounded in thick line frame in FIG. 2. And a certain level of applied voltage which forms a vertical side of the delta area is defined as a lower limit $V_{lim2}$ of a safety range of the applied voltage.

Thus, in this case, a safety range of the applied voltage given by the invention is that the upper limit of a positive applied voltage should be set to be less than or equal to the upper limit $V_{lim2}$. On the other hand, a lower limit of applied voltages not always necessary as far as no trouble such as dielectric breakdown occurs.

Using the first aspect, the applied voltage is limited before it reaches one of the coercive voltages because the area of 180° domain rotation is smaller than or equal to the area of one third 180° domain rotation. Thus, as the applied voltage to the piezoelectric material is limited in the range in which the domain rotation would not reach to a fatally large level, even if a applied voltage inverted to the polarization of the piezoelectric material is applied, it does not occur that the polarization of the material is reversed again nor that a high peak of the switching current is formed. Accordingly, a partial thermal rise and an internal stress are suppressed, so that cracks or splits do not appear in the piezoelectric actuator. Therefore, a breaking stress in the piezoelectric actuator is avoided skillfully.

Thus, the first aspect of the invention is able to prevent cracks and splits in a piezoelectric actuator effectively, because breaking stress is skillfully avoided as domain rotation does not occur too much. In other words, the first aspect is able to drive the piezoelectric actuator at its full potential (in the stroke or in the force) as far as a crack or a split does not occur.

Here, the word "split" stands for separation of a piezoelectric cell, though "crack" does not make separation.

(The Second Aspect of The Invention)

The second aspect of the invention is that, in said first aspect, said piezoelectric actuator is one selected from the group consisting of a layered piezoelectric actuator, a bimorph cell, and a unimorph cell.

In the second aspect, the piezoelectric actuator to be driven is identified clearly, as it is declared that the actuator is one selected from the group of a laminated piezoelectric actuator, a bimorph or a unimorph. Piled bimorphs or unimorphs and combined actuator made of some kinds of piezoelectric actuators are included in the group.

(The Third Aspect of The Invention)

The third aspect of the invention is that, in said first aspect, said controller is equipped with temperature measurement means, and said applied voltage limiting means is equipped with temperature compensation means which set one of the upper limit and lower limit based on a temperature measured by the temperature measurement means.

The third aspect is equipped with the temperature measurement means and the temperature compensation means. The temperature measurement means measures a operating temperature of the piezoelectric actuator, so that the temperature compensation means compensates the best safety range of the applied voltage for a characteristics of a yield field of the piezoelectric material at the very measured operating temperature.

Therefore, using the third aspect, the piezoelectric actuator can perform at the maximum potential without a risk of cracks and splits, even though the operating temperature varies in a wide range. Because the safety range are set up at the best for the very measured operating temperature.

It means that, even in a case the piezoelectric actuator is driven at an operating temperature out of a design range, there is no risk of cracks or splits, so that it makes a lifetime of the piezoelectric actuator longer, and increases its reliability. In other words, too much safety margin is not any more necessary for the worst case of the operating temperature, where the safety margin would have been set up so that no cracks nor splits occur in the worst condition. As a result, at every point in the operating temperature, the best performance of the actuator is effectively shown without any risk of cracks and splits.

|Controlling Method for Piezoelectric Actuator|

(The Fourth Aspect of The Invention)

The fourth aspect of the invention is a controlling method for piezoelectric actuator which includes a safety range setting process and a driving process. The safety range setting process is a process in which a safety range of applied voltage to a piezoelectric actuator made of piezoelectric material which provides displacement or force is set up, so that the area of 180° domain rotation of the piezoelectric material should be less than or equal to one third of the area of full 180° domain rotation of the material in one of a positive applied voltage region and a negative applied voltage region.

The driving process is a process in which said applied voltage is applied to said piezoelectric actuator with a limitation of said safety range.

The fourth aspect is able to provide operations and advantages almost similar to ones of the first aspect.

That is to say, in the safety range setting process, a safety range of a applied voltage is set up so that the area of 180° domain rotation of the piezoelectric material is smaller than or equal to one third of the area of full 180° domain rotation in one of the positive region and the negative region. And in the driving process, the applied voltage is controlled within the safety range, so that breaking stress is avoided skillfully.

Therefore, the fourth aspect is able to provide an advantage that cracks and splits in the piezoelectric actuator are prevented, because the actuator is driven in the very best safety range of the applied voltage which has been set up in the safety range setting process. In other words, the piezoelectric actuator can operate at the maximum potential, i.e., stroke or force, as far as no cracks nor splits occur.

(The Fifth Aspect of The Invention)

The fifth aspect of the invention is a controlling method for a piezoelectric actuator of said fourth aspect, in which said safety range is set up based on a measurement of a switching current characteristic to the voltage applied to said piezoelectric actuator in said safety range setting process.

In the fifth aspect, the safety range is set up based on measurement data of applied voltage and switching current characteristics of the piezoelectric actuator.

Therefore, by the fifth aspect, the safety range is set up in the manner of exact and safe way, so that the piezoelectric actuator can perform at the best potential as far as no cracks nor splits occurs. By the way, the measurement should better be done in a product checking process, so that the measurement would not be time consuming nor costing.

(The Sixth Aspect of The Invention)

The sixth aspect of the invention is a controlling method for a piezoelectric actuator of said fourth aspect, in which said safety range is set up based on one of numerical estimation and statistic data on characteristics of the material of said piezoelectric actuator in said safety range setting process.

In the sixth aspect, the safety range is set up based on statistic data or numerical estimation of characteristics of the piezoelectric material of the piezoelectric actuator.

Here, the statistic data stands for a statistic data on individual characteristics of piezoelectric actuators, which includes data based on coercive electric fields and the area of 180° domain rotation by relation with composition of the piezoelectric materials. Such a data base makes it possible to estimate the 180° domain rotation characteristics of a new piezoelectric material with new compositions by interpolation of the data base.

On the other hand, numerical estimation technology is growing up which would make it possible to predict characteristics of new piezoelectric material out of the data base.

So, the sixth aspect enables to decrease cost by eliminating the need of checking all piezoelectric actuator individually.

(The Seventh Aspect of The Invention)

The seventh aspect of the invention is a controlling method for a piezoelectric actuator of said fourth aspect, in which said safety range at every operating temperature is set up based on one of a measured operating temperature and an estimated operating temperature in said safety range setting process. In the seventh aspect, a relation between the operating temperature of the piezoelectric actuator and the area of 180° domain rotation among a range of operating temperature of the actuator is acquired beforehand by means of one of measurement, numerical estimation, and statistic data.

By the seventh aspect of the invention, a relation between a operating temperature of a piezoelectric actuator and a 180° domain rotation, i.e., an applied voltage at the area of one third 180° domain rotation is obtained by a certain means. Then, in the safety range setting process, an optimum safety range is set up by said relation based on a measured operating temperature or an estimated operating temperature of the piezoelectric actuator. In other words, a temperature compensation is made on the applied voltage.

Therefore, using the seventh aspect, the optimum safety range is set up even in case that the operating temperature is varying in wide range. Thus, the piezoelectric actuator is driven without the risk of cracks or splits even at a temperature out of design. So the aspect brings an advantage that it is possible to drive the piezoelectric actuator at its maximum potential without the risk of cracks or splits at any temperature.

(The Eighth Aspect of The Invention)

The eighth aspect of the invention is a controlling method for a piezoelectric actuator of said seventh aspect, in which said relation between said operating temperature and said safety range is memorized as a linear function, and said safety range is calculated on the linear function based on one of a measured operating temperature and an estimated operating temperature in said safety range setting process.

In the eighth aspect, a relation between an operating temperature of the piezoelectric actuator and a safety range of applied voltage. (The relation can be approximated by the form of a linear function, that would not bring a large error.) The linear function is defined by two constants, so the linear function does not need a lot of memory, that leads to saving the memory volume or the temperature compensating circuit.

Therefore, the eighth aspect brings an advantage that the temperature compensation on the safety range of the applied voltage is made very simple and easy.

BRIEF DESCRIPTION OF THE DRAWINGS

A more complete application of the present invention and many of its advantages will be readily obtained as the same becomes better understood by reference to the following detailed description when considered in connection with the accompanying drawings and detailed specification, all of which forms a part of the disclosure:

FIG. 7 is a block diagram showing the construction and the operation of the driving apparatus of the Second Preferred Embodiment.

DETAILED DESCRIPTION OF THE PREFERRED EMBODIMENTS

Having generally described the present invention, a further understanding can be obtained by reference to the specific preferred embodiments which are provided herein for the purpose of illustration only and not intended to limit the scope of the appended claims.

A First Preferred Embodiment and its Modified Versions will be hereinafter described with reference to FIGS. 3 through 5. Thereafter, a Second Preferred Embodiment will be described with reference to FIGS. 6 and 7.

First Preferred Embodiment

Production of Piezoelectric Actuator for the First Preferred Embodiment

Mixed powder of micro ceramic powder and binder, which constitutes a piezoelectric material, was compressed. Thereafter, the compressed mixed powder was pressed by CIP (Cold Isostatic Pressing) to form a compact. Grease was removed from the press-formed compact. Then, the compact was heated up to 1200 Celsius degree in an electric furnace, and kept for 4 hours at the same temperature to obtain a sintered block. The sintered block was squared to be square sheets with sides of 12 mm and thickness of 0.5 mm. Thereafter, silver paste was printed on the both sides of the sheets by screen printing to form surface electrodes made of silver.

Fifty of the sintered sheets with the surface electrodes were put on each other in pile, so that each polarized electrodes are facing the same electrodes of the next. In the manner hereinbefore, laminated piezoelectric actuators were produced for a driving (or controlling) apparatus and a driving (or controlling) method of the First Preferred Embodiment.

Measurement of Switching Current Applied Voltage Characteristics, i.e., 180° domain rotation For a purpose of measuring characteristics of 180° domain rotation, a characteristics of switching current/applied voltage of a piezoelectric actuator under compression stress of 20 MPa was measured. In the measurement, applied voltage was in a shape of delta wave with an amplitude of plus-minus 1000 V in the cycle of 0.1 Hz (i.e., the period was 10 second.).

Figure 1:
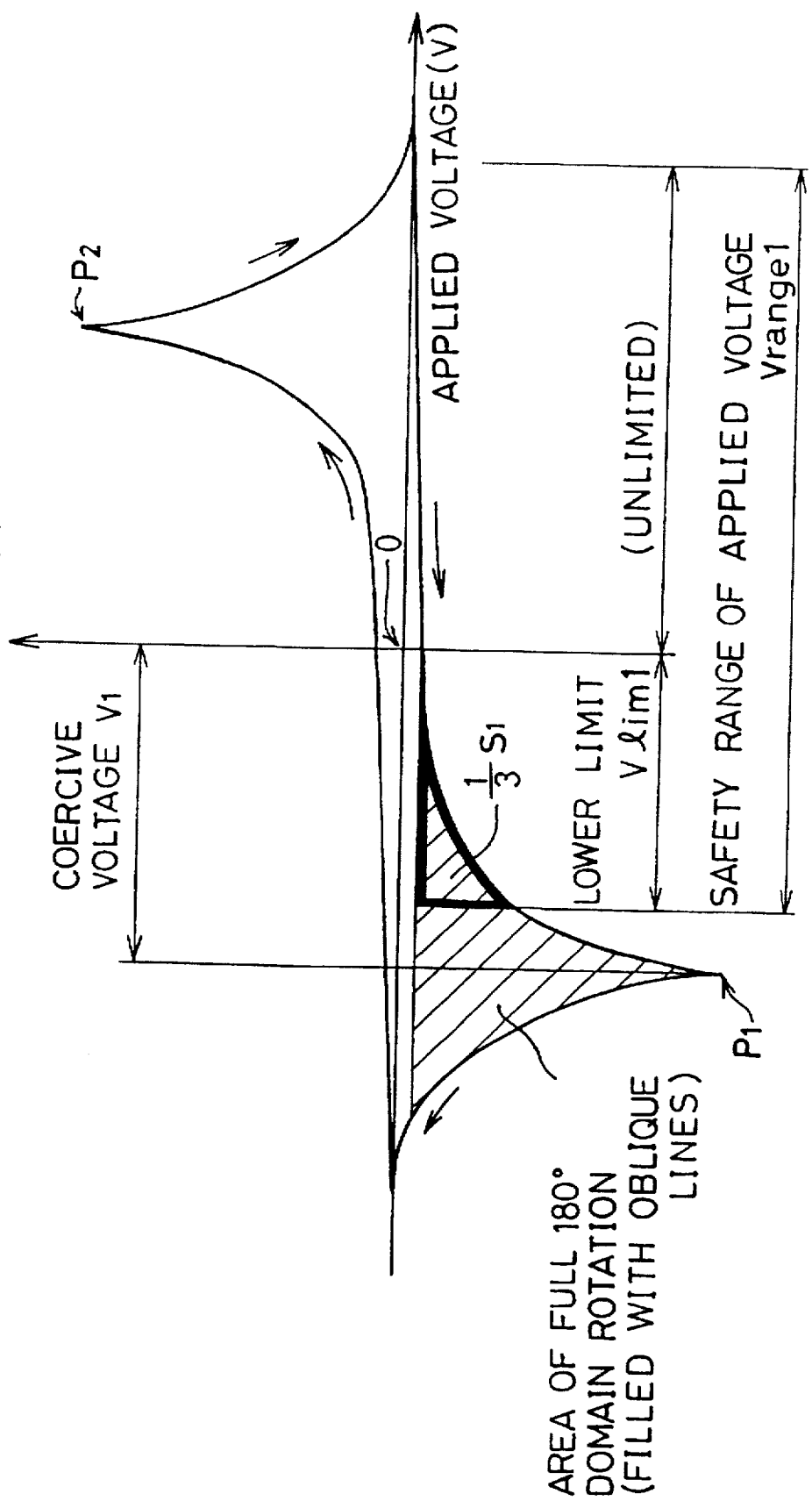
FIG. 1 is a graph chart schematically showing the safety range (the lower limit) of the applied voltage according to the present invention.
Figure 2:
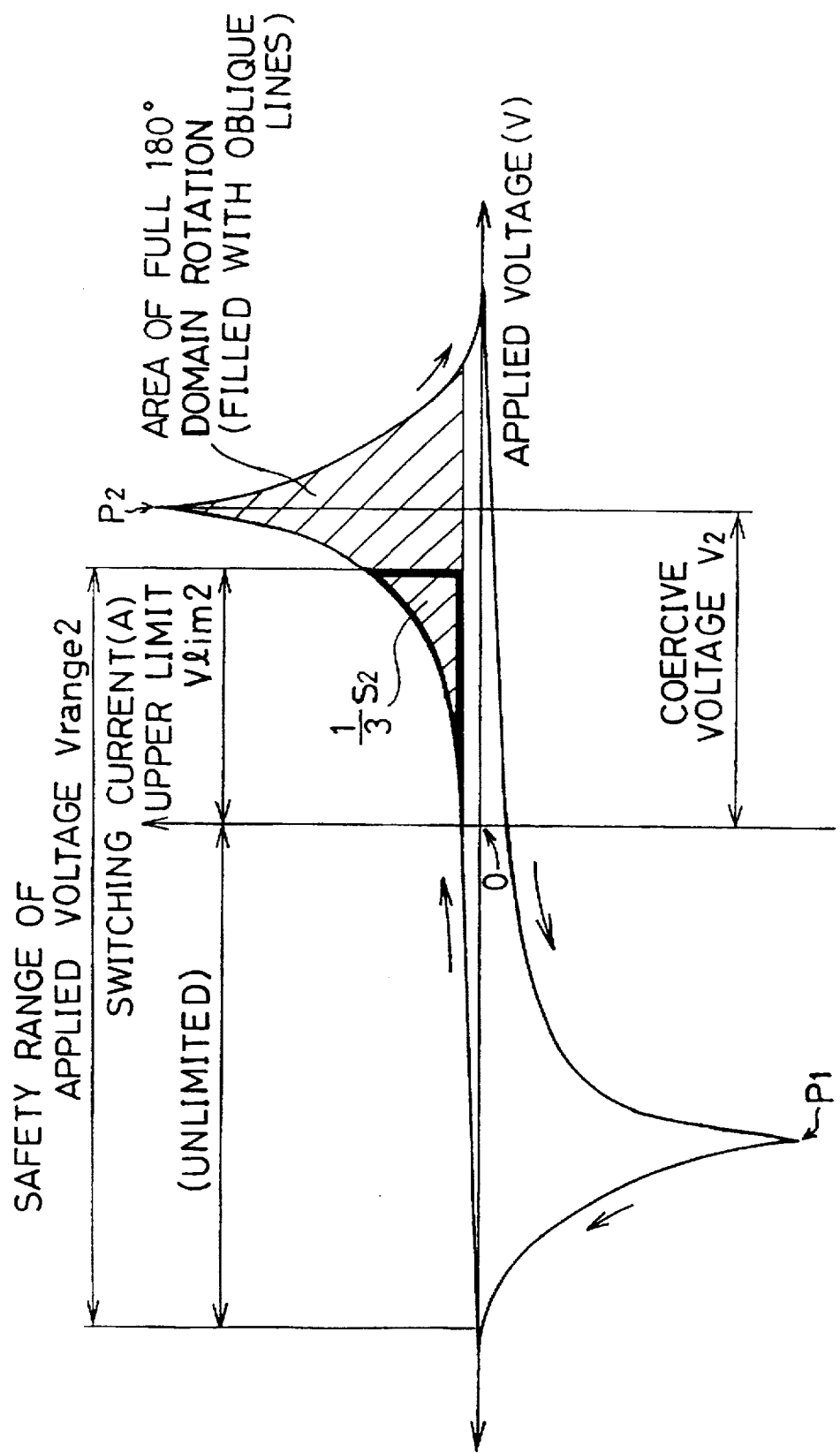
FIG. 2 is a graph chart schematically showing the safety range (the upper limit) of the applied voltage according to the present invention.
Figure 3:
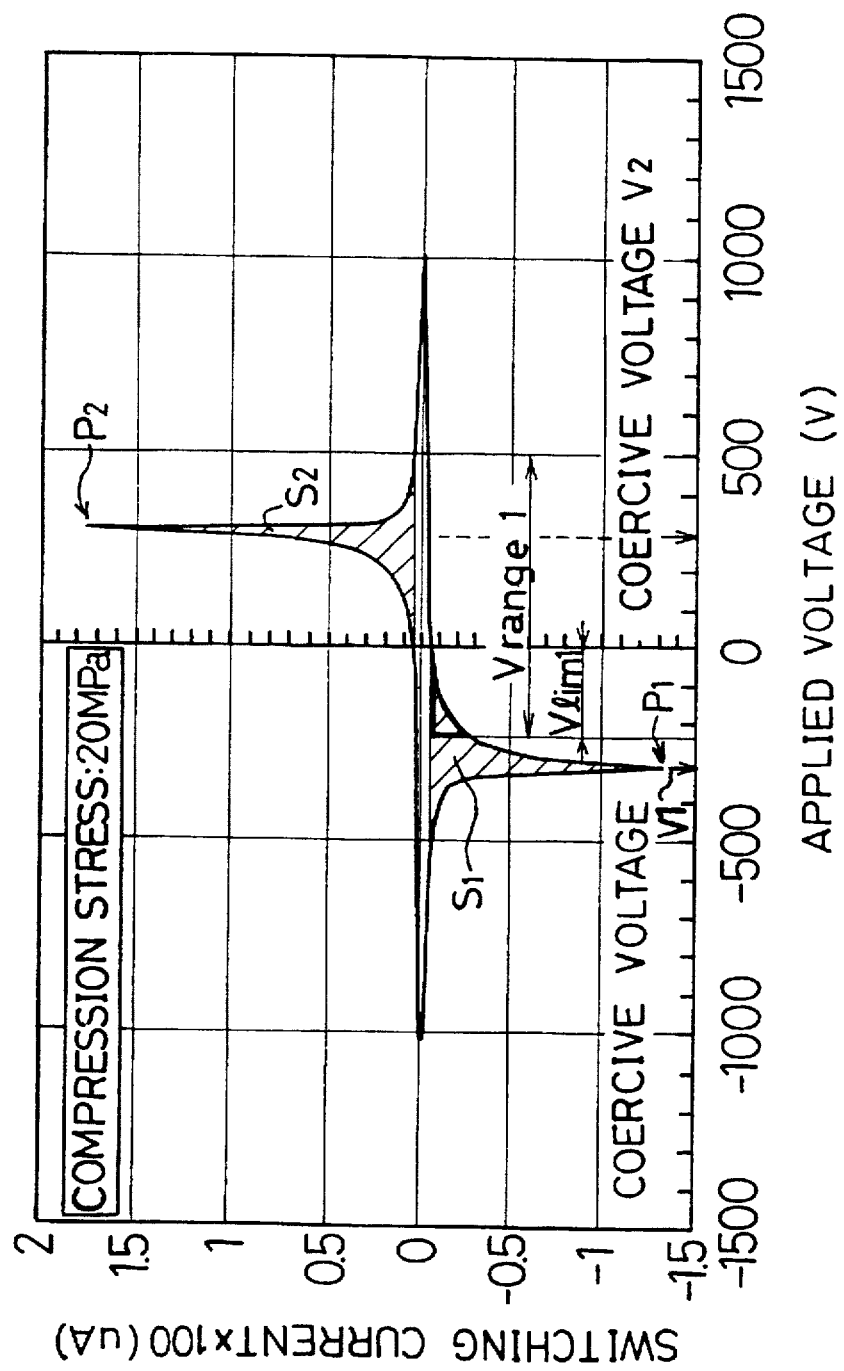
FIG. 3 is a graph chart showing the safety range (the lower limit) of the applied voltage in the First Preferred Embodiment.

As a result, switching current/applied voltage characteristics with hysteresis was recorded as shown in FIG. 3.

On the detail of switching current/applied voltage graph, 180° domain rotation occurred at the applied voltage where the switching current shows drastic changes. It corresponds to the area $S_1$ and $S_2$ in the FIG. 3. In the FIG. 3, the switching current shows the amount of 180° domain rotation, while the area of switching current x applied voltage (all of the area with oblique lines) shows the area of full 180° domain rotation.

The current peak $P_1$ is on the negative region of the applied voltage, while the another current peak $P_2$ is on the positive region. Each of the applied voltage $V_1$, $V_2$ corresponding respectively to the peak $P_1$, $P_2$ is generally called "the coercive voltage". (While it is called "the coercive electric field" in case of a piezoelectric material.) Therefore, the area of 180° domain rotation increases when the applied voltage is going over the coercive voltage $V_1$ or $V_2$. By the way, the current peak $P_1$, $P_2$ appear in both region of the positive voltage and the negative, because the direction of polarization in a piezoelectric material turns over when the applied voltage surpasses over the coercive voltage $V_1$ or $V_2$.

The area of switching current x applied voltage, i.e., integration of switching current by applied voltage is defined as "the area of 180° domain rotation", and all the area with oblique lines is defined as "the area of full 180° domain rotation". That is to say, in the process of sweeping the applied voltage from the positive region to the negative region, the switching current level at the applied voltage of 0 V forms an upper base line of a triangle area with oblique lines, which area $S_1$ has the peak $P_1$ and is defined as "the area of full 180° domain rotation". Then, an area of switching current x applied voltage surrounded by bold frame from an applied voltage of 0 V to a certain negative applied voltage is defined as "the area of 180° domain rotation".

An Experiment Proving The Safety Range of The Present Invention

The inventors have turned out attention to the area of 180° domain rotation, and have got an idea that a limitation of applied voltage should be set by limiting the area of 180° domain rotation within a certain percentage of the area of full 180° domain rotation $S_1$ or $S_2$, instead of limiting the applied voltage by some percentage of the coercive voltage $V_1$ or $V_2$ as in the conventional way. Because the inventors thought that limiting the area of 180° domain rotation directly stands for limiting domain rotation in the piezoelectric material, and also stands for preventing from damaging micro-structure of the material.

So, the inventors made a series of experiments and made it clear that until what percentage of the area of 180° domain rotation in the area of full 180° domain rotation, no cracks nor splits occurs in piezoelectric actuators.

In the experiments, above mentioned actuators are examined, and a higher limit of the applied voltage is always set at 500 V, while a lower limit of the applied voltage varied for some cases. A lower limit of the applied voltage is set that the area of 180° domain rotation is at 10%, 20%, 30%, 40%, 60%, 80%, and 100% of the area of full 180° domain rotation in the experiments. The conditions of the experiments were that, the operating temperature was set at 50 degree Celsius, the compression load was set at 50 kg (corresponding at 20 MPa of compression stress), and the repeating time running between the upper limit of the applied voltage range and the lower was $10^5$ times.

Figure 4:
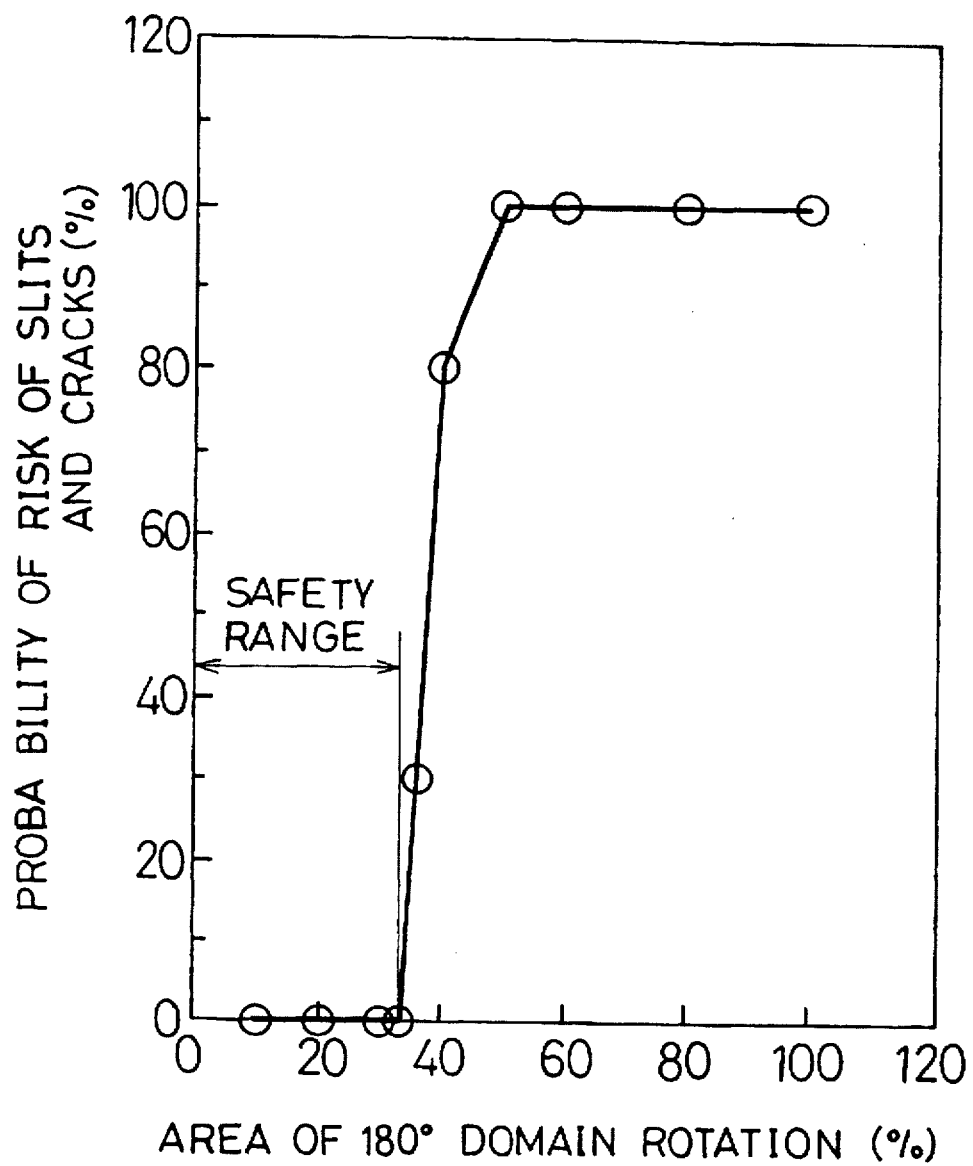
FIG. 4 is a graph chart showing the relation between an area of 180° domain rotation and a risk of slits and cracks.

As a result, as shown in FIG. 4, a probability of cracks and splits were rising from 0% to 80% in the range from 30% to 40% of the area ratio, and it was supposed that sudden change was occurring in this range of the area ratio. Then, additional experiments were carried out at 33% and 37% of the area ratio, i.e., the ratio of the area of 180° domain rotation in the area of full 180° domain rotation. The result was that the probability of cracks and slits was 0% at 33% of the area ratio, while the same probability was 30% at 37% of the area ratio. FIG. 4 shows a relationship between the area ratio and the probability of cracks and slits.

Therefore, the inventors have set a lower limit $V_{lim1}$ of the safety range of a applied voltage at the voltage on which the area of 180° domain rotation is one third of the area of full 180° domain rotation. Based on the result of the experiments, now it is clear that, if the lower limit of the applied voltage is set in the safety range, the probability of occurring of cracks or splits would be almost zero. On the other hand, the upper limit of the applied voltage is not particularly limited at 500 V and is usually limited by design of a control apparatus and so forth.

Controller and Controlling Method for Piezoelectric Actuator as the First Preferred Embodiment Based on the results of the experiments and considerations, a controller for a piezoelectric actuator of the present invention was manufactured by way of trial, and is under operation by the controlling method of the present invention.

That is to say, the controller of the First Preferred Embodiment is a controller that drives a piezoelectric actuator mentioned above by applying in a certain range of applied voltage, and is equipped with an applied voltage limiting means. In the applied voltage limiting means, the lower limit of an applied voltage $V_{lim1}$ is set in the way that the area of 180° domain rotation of the piezoelectric material of the actuator is smaller than or equal to the safety limit, i.e., one third of the area of full 180° domain rotation of the material.

In other words, in the controller of the First Preferred Embodiment, the safety range $V_{range1}$ is set previously by measuring a current characteristics to a applied voltage on a piezoelectric actuator. Namely, measuring the switching current/applied voltage characteristics, in the negative range of applied voltage on the piezoelectric actuator, an area of 180° domain rotation of the piezoelectric material of the actuator is calculated in accordance with each level of applied voltages. The lower limit of the safety range $V_{lim1}$ is set that a area of 180° domain rotation is to be smaller than or equal to one third of the area of full 180-degree polarization reversal of the piezoelectric material.

After that, in the driving process, the controller of the embodiment applies voltage to a piezoelectric actuator in a limitation within the safety range with $V_{range1}$. Therefore, the piezoelectric actuator is driven in a long stroke without any cracks or splits.

As mentioned above, by use of the controller and the controlling method for a piezoelectric actuator as the First Preferred Embodiment, the piezoelectric actuator is efficiently driven without cracks or splits. Thus, the controller and the controlling method for a piezoelectric actuator is presented that can be driven with a stroke nearly as long as designed, and causes no cracks nor splits in the actuator.

In other words, the First Preferred Embodiment has presented means for setting more effective safety range, instead of the conventional way of setting a safety range by considering a coercive voltage only.

First Modified Version of the First Preferred Embodiment

Almost similarly to the First Preferred Embodiment, a safety range of applied voltages can be limited by the positive voltage limit $V_{lim2}$.

Figure 5:
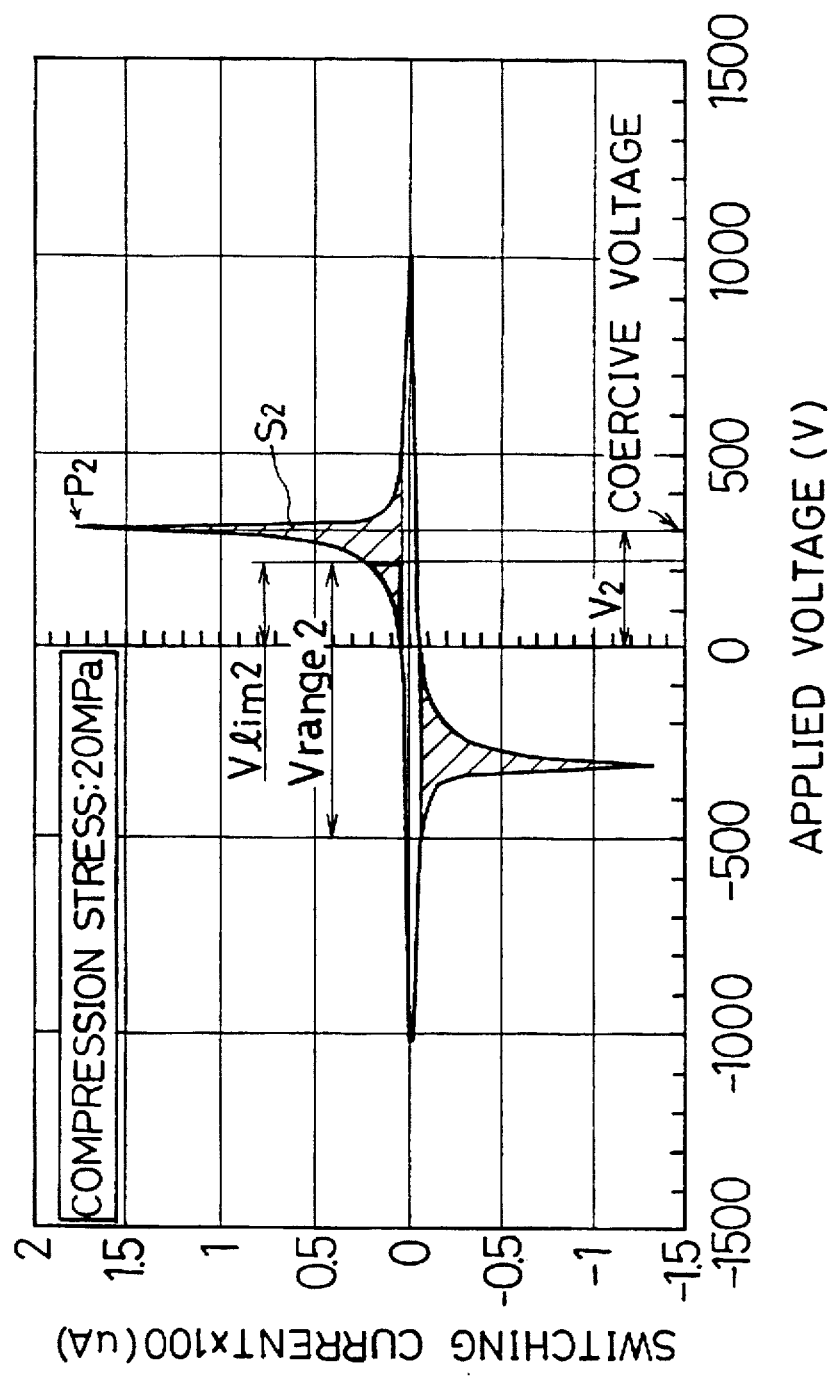
FIG. 5 is a graph chart showing the safety range (the upper limit) of the applied voltage in the First Preferred Embodiment.

That is to say, as shown in FIG. 5, in the process of sweeping an applied voltage from the negative range to the positive range, the area filled with oblique lines with a positive current peak $P_2$ is defined as the area of full 180° domain rotation. And a positive limit of the safety range is defined as a positive voltage level at which an area of 180° domain rotation (surrounded by a bold line) is one third of the area of full 180° domain rotation.

Therefore, the positive maximum limit of the range of applied voltage can be set below the upper limit $V_{lim2}$. In this case, on the other hand, there is no need to limit the applied voltage in the negative range especially.

Second Modified Version of the First Preferred Embodiment

One of the safety ranges of a applied voltage mentioned above can be set up with an appropriate margin i.e., a safety margin to the lower limit $V_{lim1}$ or to the upper limit $V_{lim2}$. Although the safety margin might ruin the performance of a piezoelectric actuator by a little bit, it can contribute to high reliability because it gives a tolerance to some variations of the actuators, the variation of the operation temperature, variation of the controllers, and variation of source voltage.

Third Modified Version of the First Preferred Embodiment

In the safety range setting process mentioned above, as means of setting a safety range of applied voltage other than measuring the switching current/applied voltage characteristics, the safety range may be obtained by estimation or numerical calculations based on statistic data of material characteristics of piezoelectric actuators, or based on material science. Using these means will enable to set a safety range without measuring even in case that measuring switching current/applied voltage characteristics is somehow impossible.

Fourth Modified Version of the First Preferred Embodiment

A bimorphs or a unimorph can be used as a piezoelectric actuator s to be driven by way of the First Preferred Embodiment, instead of a single piezoelectric actuator or a laminated piezoelectric actuators. And furthermore, the First Preferred Embodiment can be applied to any kind of piezoelectric actuators.

Second Preferred Embodiment

In the First Preferred Embodiment mentioned above, it is supposed that the operating temperature is almost constant and is predictable by a tacit understanding. In the Second Preferred Embodiment, however, it is supposed that an operating temperature of a piezoelectric actuator varies in a certain wide range. So, the Second preferred Embodiment will illustrate a controller and a control means which can drive a piezoelectric actuator appropriately with an operating temperature compensation in case that a switching current/applied voltage characteristics varies with a change of the operating temperature. Here, appropriate driving means driving a piezoelectric actuator with its maximum strokes without a risk of cracks and splits.

Variation of Switching Current/Applied Voltage Characteristics Caused by Variation of an Operating Temperature To achieve above-mentioned purpose, it is essential to measure, to calculate, or to estimate the applied voltage level at which an area of 180° domain rotation is one third of an area of full 180° domain rotation. In the Second Preferred Embodiment, the same piezoelectric actuator as the First preferred Embodiment are chosen as a test piece, and its switching current/applied voltage characteristics were measured at various operating temperatures.

Figure 6:
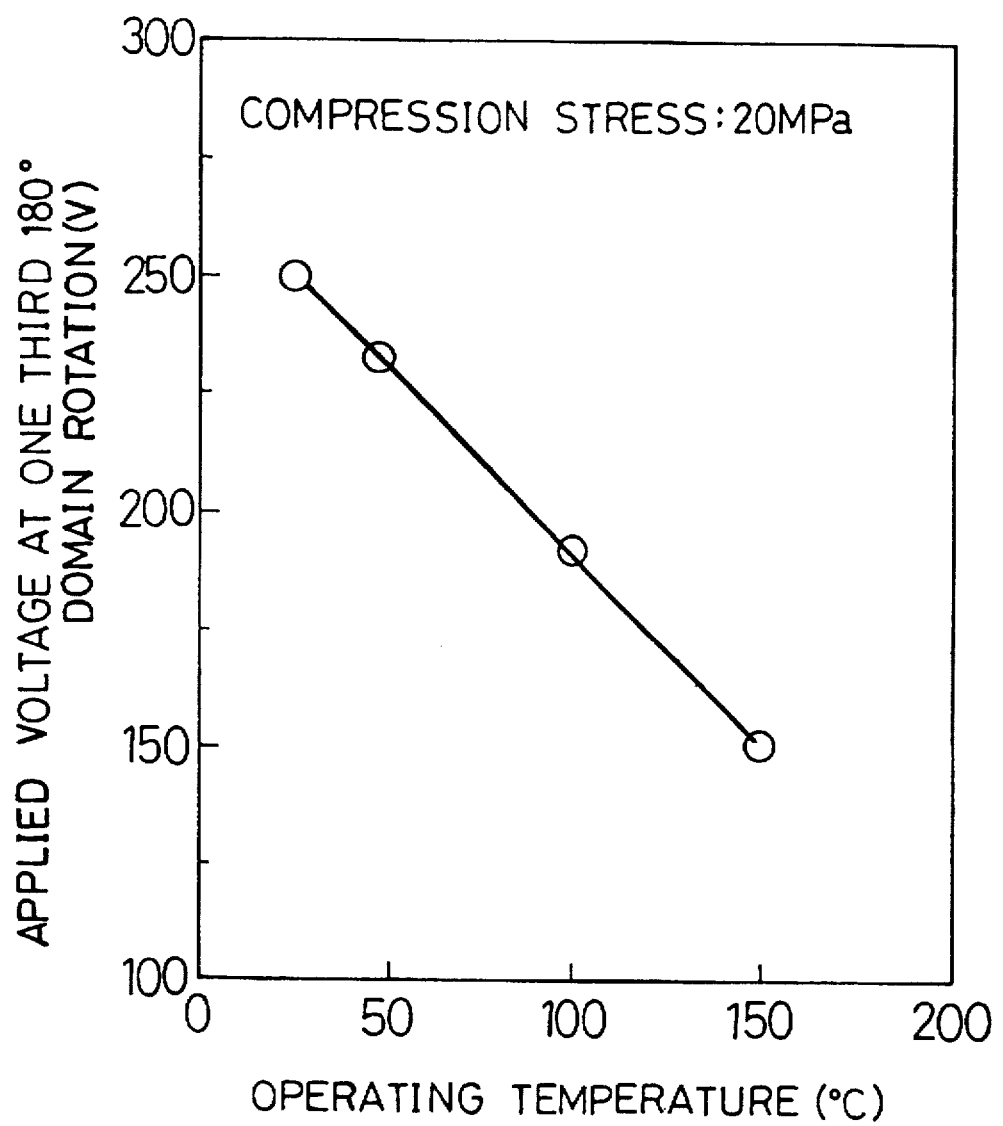
FIG. 6 is a graph chart showing the relation between the operating temperature and the applied voltage at the one third 180° domain rotation.

As a result, it is made clear that the higher becomes operating temperature, the lower becomes the absolute value of coercive voltages of the piezoelectric actuator, that is, the coercive voltage comes nearer to zero voltage. This tendency is commonly found in many kinds of piezoelectric materials. Therefore, the applied voltage level at which an area of 180° domain rotation is one third of the full 180° domain rotation (the applied voltage level is called "one-third voltage" hereafter for the sake of convenience), as shown in FIG. 6, comes closer to zero volt as the operating temperature comes higher. Here, FIG. 6 is a graph chart which shows a relation between the operating temperature and the one-third voltage.

In this measurement, switching current/applied voltage characteristics are measured at four point of the operating temperature from room temperature to 150° C. As far as based on the measured data on FIG. 6, very accurate linearity is found between the operating temperature and the one-third voltage. Thus, the relation between the operating temperature and the one-third voltage can be presented by a linear function with little error.

Controller and Controlling Method as the Second Preferred Embodiment

As shown in FIG. 7, controller of the Second Preferred Embodiment is equipped with a temperature compensating circuit 2 and a driving circuit 10, where the temperature compensating circuit 2 is mainly consist of a differential amplifier 20.

That is, the temperature compensating circuit 2 consists of a temperature sensor 23, temperature measuring circuit 22, a reference temperature circuit 21, and a differential amplifier 20. The temperature sensor 23 is a thermister patched on the piezoelectric actuator 3, and senses the temperature of the piezoelectric actuator under operation at every interval. The temperature measuring circuit 22 provides a voltage output T which corresponds to a measured operating temperature of the piezoelectric actuator 3, based on a temperature signal measured by the temperature sensor 23. The measured temperature voltage T is input to one of the two input terminals of the differential amplifier 20. In parallel with it, voltage level T' corresponding to the reference temperature is input to the another terminal of the differential amplifier 20. The differential amplifier 20 amplifies the difference of the both voltage (T−T') with the amplitude ratio corresponding to an inclination of the linear function mentioned above, and generates a temperature compensation voltage C as an input to the driving circuit 10.

The driving circuit 10 is compensated by the operating temperature based on the temperature compensation voltage C. And similarly, in the driving circuit 10, a lower limit $V_{lim1}$ or an upper limit $V_{lim2}$ of a safety range of the applied voltage is set up. Then, the driving circuit 10 is driven by a driving signal D input from a controller (not shown), so that the driving circuit 10 generates the applied voltage F compensated by the operating temperature within a safety range $V_{range1}$ or $V_{range2}$, and drives the piezoelectric actuator 3.

Here, setting of the linear function based on measuring the one-third voltage (i.e., the lower limit $V_{lim1}$ or the upper limit $V_{lim2}$) of switching current/applied voltage characteristics at every temperature corresponds to setting of the reference temperature T' and the amplitude ratio of the differential amplifier. And those correspond to the safety range setting process. In the safety range of which the upper limit or the lower limit is the linear function of the operating temperature T, the operation of the controller 1 which derives the applied voltage F based on the driving signal D for the piezoelectric actuator corresponds to the driving process. Thus, the controlling method of the Second Preferred Embodiment is realized by setting of the controller 1 and operating of the same controller 1 to drive the piezoelectric actuator 3.

The inventors made some experiments by use of controller 1 with said structure and operation. And it was made clear that no cracks and no splits occurred in the piezoelectric actuator in all cases the operating temperature of the actuator is 50° C. 100° C., and 150° C.

For a comparison, some experiments without temperature compensation in three temperature cases as same as above mentioned experiments were carried out. In the experiments, the safety range was set up so that the area of 180° domain rotation is one third of the area of full 180° domain rotation at 50° C. operating temperature of the piezoelectric actuator. As a result, no cracks and no splits occurred in the case at the same operating temperature is 50° C., as expected. But cracks and splits occurred by 50% in the case at 100° C., and by 100% in the case of 150° C. Therefore, without temperature compensation, operating temperature rise of just 50° C. more than the designed temperature would cause significant damage on the piezoelectric actuator.

On the other hand, the temperature compensation of the Second Preferred Embodiment derives such advantage that the piezoelectric actuator is driven at maximum of its potential in considerably wide variation of the operating temperature without cracks nor splits.

Operation and Advantage of Second Preferred Embodiment

As mentioned above, the same operation and advantages as those of the First Preferred Embodiment are shown even on a piezoelectric actuator with its operating temperature varied over a wide range. Therefore, the controller and its controlling method of the Second Preferred Embodiment can present the following advantages.

First of all, the Embodiment enables to drive the piezoelectric actuator 3 at its maximum strokes without cracks or splits in a considerably wide range of the operating temperature.

Because the controller 1 of the Embodiment is equipped with the temperature measuring means consisting of the temperature sensor 23 and the temperature measuring circuit 22 and the temperature compensating means consisting mainly of the differential amplifier 20. Said temperature measuring means measures the operating temperature of the piezoelectric actuator under operation. And based on the coercive voltage characteristics, i.e., the switching current/ applied voltage characteristics of the piezoelectric material at the measured operating temperature, most appropriate compensation C of the safety range of the applied voltage is provided by said temperature compensating means.

Therefore, by use of the Embodiment, the most appropriate safety range is set at the present operating temperature even if the operating temperature varies so much, so that an advantage is derived that the piezoelectric actuator 3 is driven at its best ability without the risk of cracks or splits.

That is to say, in case that the piezoelectric actuator 3 is operated out of predicted design range of the operating temperature, there causes no cracks nor splits in the actuator 3. That results in improving reliability and lifetime of the piezoelectric actuator 3. In other words, too much safety margin for preventing occurrence of cracks or splits in any worse variation of the operating temperature is not necessary any more. As a result, there derives the advantage that the Embodiment enables to drive the piezoelectric actuator 3 at its maximum ability till the border limit of causing cracks or splits.

Second, the structure of the temperature compensation circuit 2 is very simple, so that effective temperature compensation mentioned above is achieved with a low cost.

That is, the relation between the operating temperature T of the piezoelectric actuator and the safety range is stored in the temperature compensation circuit 2 as a linear function in the controller of the Embodiment. Here, the reference temperature T' and the amplification ratio of the differential amplifier 20 are the parameters which makes said linear function unique.

Thus, by use of the controller and the controlling method for a piezoelectric actuator as the Second Preferred Embodiment, there derives advantages that it is very simple and easy to make the operating temperature compensation in the safety range of the applied voltage.

What is claimed is:

1. A controller for a piezoelectric actuator made of a piezoelectric material, the controller driving the actuator by applying a voltage in a predetermined range, thereby producing a displacement or a force due to piezoelectric effect, said controller comprising:

applied voltage limiting means for setting one of an upper limit and a lower limit of the applied voltage so that an area of 180° domain rotation falls in a safety range being one third or less an area of full 180° domain rotation.

2. The controller according to claim 1, wherein said piezoelectric actuator is selected from the group consisting of a laminated piezoelectric actuator, a bimorph and a unimorph.

3. The controller according to claim 1 further comprising:

temperature measuring means for measuring an operating temperature of said piezoelectric actuator; and temperature compensating means for setting said one of the upper and lower limits based on the operating temperature measured by said temperature measuring means.

4. A method for controlling a piezoelectric actuator made of a piezoelectric material comprising the steps of:

setting a safety range of a voltage to be applied to the piezoelectric actuator so that an area of 180° domain rotation is within one third of an area of full 180° domain rotation in one of positive and negative regions of the applied voltage, and driving the actuator to produce a displacement or force due to piezoelectric effect by applying the voltage controlled within said safety range.

5. The method according to claim 4, wherein said safety range is set by measuring characteristics of a switching current with respect to the applied voltage .

6. The method according to claim 4, wherein said safety range is set based on at least one data selected from the group consisting of statistic data on physical properties of the piezoelectric actuator and numerically estimated data of the same.

7. The method according to claim 4, wherein a relationship between the area of 180° domain rotation and an operating temperature of the actuator is determined by actual measurement, numeric estimation, or statistic data; and the safety range is set for the operation temperature from said relationship based on an actually measured value or an estimated value of the operating temperature.

8. The method according to claim 7, wherein said relationship is stored as a linear function; and said safety range is derived from said stored linear function.

* * * * *